United States Patent [19]

Shibata

[11] 4,129,833
[45] Dec. 12, 1978

[54] MULTIVIBRATOR

[75] Inventor: Toshiji Shibata, Toride, Japan

[73] Assignee: Meisei Electric Co. Ltd., Tokyo, Japan

[21] Appl. No.: 826,272

[22] Filed: Aug. 12, 1977

Related U.S. Application Data

[63] Continuation of Ser. No. 707,076, Jul. 20, 1976, abandoned.

[30] Foreign Application Priority Data

Jul. 31, 1975 [JP] Japan .................................. 50/93635

[51] Int. Cl.$^2$ ............................................. G01K 7/16
[52] U.S. Cl. ................................... 331/66; 324/65 R; 331/111
[58] Field of Search ..................... 331/108 D, 111, 65, 331/66, 176; 324/65 R Primary Examiner—John Kominski
Attorney, Agent, or Firm—Toren, McGeady and Stanger

[57] ABSTRACT

The present invention relates to a resistance-frequency converting circuit for converting measurement values of a physical object of meteorological phenomena into electrical signals.

The resistance-frequency converting circuit in accordance with the present invention substantially consists of a multivibrator consisting of a combination of one or more NOT-circuits with time constant circuits, whereby the time constant circuits are so designed that the discharge time remarkably differs from the charging time while the time constant circuit includes weather sensing elements, that is meteorological sensors, whose resistance values are determined in accordance with the states of the meteorological factors.

16 Claims, 6 Drawing Figures

MULTIVIBRATOR

This is a continuation of application Ser. No. 707,076 filed July 20, 1976 now abandoned.

BACKGROUND OF THE INVENTION

As one of the routine tasks in weather observation various kinds of weather parameters such as the wind direction, the wind velocity, the temperature, the humidity, the atmospheric pressure and so on are measured by an observation instrument provided in a balloon, whereby the measurement values are sent to the receiving station on the ground by means of radiowave radio transmission. Such observation instrument as is provided in a balloon is called a radiosonde.

It is necessary for a radiosonde to operate from the time the radiosonde is freed on the ground till it flies up to the altitude of about 30 km, whereby as the ambient conditions, temperature ranges from $+40°$ C.--$80°$ C., atmospheric pressure from 1040 mb-1 mb and humdity from 1%-100%, prevail, constituting very severe conditions for the observation instrument. Further the radiosonde must be constructed rigidly against the vibration and shocks sustained during flying. Further it is expendible, because it cannot be recovered later.

Under such circumstances it is necessary that the instruments for a radiosonde should be compact, light and cheap and further should maintain stable characteristics even under the above mentioned severe ambient conditions. On the other hand the time during which the radiosonde should maintain the characteristics in one observation is several hours at most.

Consequently it must be considered that the measuring circuit a for radiosonde should meet requirements completely different from those for the stationary installations on the ground or for ordinary equipment in ordinary daily life. As to the conventional method for measuring various kinds of weather elements by means of a radiosonde, a measuring element such as thermister or carbon hygrometer whose electrical resistance changes in accordance with the change of the state of the physical parameter, for example, in the case of the weather situation, is used as the weather sensing element, by means of the change of whose electrical resistance the change of the state of various weather factors is detected. In consequence, the above mentioned weather sensing element is connected to a circuit such as a blocking oscillator or a multivibrator whose oscillation frequency is determined by the resistance or the capacitance in the circuit in such a manner that the change of the weather conditions is converted into a change of the oscillation frequency. Such combination of the oscillation circuit with the weather sensing element is an example of the resistance-frequency converting circuit.

Hereby the blocking oscillator needs an oscillation transformer, so that both the weight and the size of the circuit becomes large and further the oscillator itself becomes expensive. Namely the blocking oscillator is not suited as the device for a radiosonde to be mounted in a balloon as an expendible element.

Under such circumstances until now instead of a blocking oscillator a resistance-frequency converting circuit consisting of a multivibrator without a transformer has been proposed for a radiosonde.

FIG. 1 shows the circuit diagram of the conventional resistance-frequency converting circuit for a radiosonde in which a multivibrator is used. FIG. 2 shows wave forms at the points shown in FIG. 1.

In FIG. 1, 1 and 2 are the inverters for NOT-circuit, 3 the resistance whose value is $R_S$, 4 the resistor whose resistance is R, 5 the weather sensing element whose resistance value is variable (the variable resistance value is let $R_X$), 6 the condenser whose capacitance is C, 7 the output terminal, $V_{DD}$ the voltage at the positive terminal of the power source and $V_{SS}$ the voltage at the negative terminal of the power source.

In the inverters 1 and 2 the complementary symmetry metal-oxide semiconductor integrated circuits (hereinafter called C MOS IC) are used, because C MOS IC possesses such advantages as low electric power consumption, high noise immunity, wide operation voltage range, wide operation temperature range, high input impedance and so on.

Generally C MOS IC includes a protective circuit in the form of a diode connected in such a manner that when a voltage higher than the above mentioned $V_{DD}$ or lower than the above mentioned $V_{SS}$ is applied to the input terminal of the C MOS IC, the part above $V_{DD}$ or below $V_{SS}$ can be clipped.

In consequence the wave at the point $P_3$ in FIG. 1 assumes, as is shown in $P_3$ in FIG. 2, a form in which it is clipped during the intervals $t_1$ and $t_2$ during which the applied voltage is above $V_{DD}$ or below $V_{SS}$. The wave forms in FIG. 2 respectively correspond with those appearing at the points with the corresponding indication figures in FIG. 1.

The input terminal of the inverter 1 is connected to $P_2$, the connecting point of the weather sensing element 5 and the condenser 6 through the resistor 3. If the voltage at the point $P_2$ is higher than the threshold level $V_1$ of the inverter 1, the level of the output of the inverter 1 becomes low. When this low level output of the inverter 1 is put in the input terminal of the inverter 2 the level of the output of the inverter 2 becomes high.

Because now the level at the output terminal of the inverter 2, namely at the point $P_1$ is high while the level at the output terminal of the inverter 1, namely at the point $P_4$ is low, a current runs from the point $P_1$ to the point $P_4$ through the condenser 6, the weather sensing element 5 and the resistance 4 in such a manner that, as is shown in $t_3$ of $P_2$ in FIG. 2, the voltage at the point $P_2$ is gradually reduced in accordance with the time constant of the circuit consisting of the condenser 6, the weather sensing element 5 and the resistor 4. When thus the voltage at the point $P_2$ has reached the threshold level $V_1$ of the inverter 1, the output of the inverter 1 changes from the low level to the high level while the output of the inverter 2 changes from the high level to the low level. Consequently at this time a current runs from the point $P_4$ to the point $P_1$ through the resistor 4, the weather sensing element 5 and the condenser 6, whereby, as is shown in $t_4$ of $P_2$ in FIG. 2, the voltage at the point $P_2$ increases gradually in accordance with the time constant of the circuit consisting of the resistor 4, the weather sensing element 5 and the condensor 6 until it reaches the threshold level $V_1$ of the inverter 1, when the output of the inverter 1 and that of the inverter 2 are respectively inverted. After then the above mentioned operation is repeated so as to maintain the oscillation.

Let us suppose that no current flows through the resistance 3, then in FIG. 2

$$t_3 = C(R + R_X)\ln \frac{V_2}{V_1}$$

$$t_4 = C(R + R_X)\ln \frac{V_3}{V_{DD} - V_1}$$

Hereby $V_{SS} = 0$. As to the oscillation frequency f:

$$f = \frac{1}{t_3 + t_4} = K \cdot \frac{1}{C(R + R_X)} \qquad (1)$$

Hereby K is a constant. In practice a current flows through the resistor 3 and it is an object of the present invention to solve the phenomenon due to this current.

It can be understood from (1) that the oscillation frequency is reciprocally proportional to the resistance value of the weather sensing element.

On the other hand at the point in time at which the output of the inverter 2 is inverted the voltage at the point P2 becomes equal to the power source voltage applied to the inverters 1 and 2. Namely, at this time at the point P2 in FIG. 2

$$V_2 - V_1 = V_{DD} - V_{SS}$$

whereby the peak value of the voltage at the point P2 is higher than the threshold level $V_1$ of the inverter 1 by the power source voltage ($V_{DD}$ - $V_{SS}$), so that as to $t_3$ in FIG. 2 a voltage higher than the voltage $V_{DD}$ at the positive terminal of the power source is applied to the input terminal of the inverter 1 during the time interval $t_1$.

When, as explained before, the voltage applied to the input terminal of C MOS IC exceeds the power source voltage $V_{DD}$, the excessive part is clipped by means of the protection means as is indicated by $t_1$ of $P_3$ in FIG. 2 so that a current flows into the input terminal of the inverter 1 through the resistor 3 during the time interval $t_1$.

The current flowing into the point 2 through the resistor 4 and the weather sensing element 5 flows to the resistor 3 and the condenser 6. Namely during the time interval $t_1$ the circuit is equivalent to one in which the series circuit of the resistor 4 and the weather sensing element 5 is connected in parallel with the resistor 3. Namely in FIG. 2, the time constant during $t_1$ differs from that during ($t_3$ - $t_1$) in such a manner that the time constant for determining the oscillation frequency alters, so that the equation (1), is not fulfilled in reality, whereby the resistance value $R_X$ of the weather sensing element 5 is not precisely in reciprocal proportion to the oscillation frequency.

A similar phenomenon takes place during $t_2$.

Thus, it is impossible to obtain the change of the resistance value of the weather sensing element 5 precisely from the frequency of the multivibrator in accordance with the equation (1).

It is an object of the present invention to solve the problem present in conventional circuits, wherein the change of the resistance value of the weather sensing element cannot be obtained precisely.

An object of the present invention is to provide a multivibrator by means of which the change of the resistance value of the weather sensing element can be precisely converted into a frequency signal.

Another object of the present invention is to provide a multivibrator by means of which the change of the resistance value of the weather sensing element can be precisely converted into a frequency signal in accordance with a certain determined formula.

Further another object of the present invention is to provide a resistance-frequency converting circuit for weather observation by means of which the change of the resistance value of the weather sensing element can be precisely converted into a frequency signal.

Further another object of the present invention is to provide a compact and light resistance-frequency converting circuit for weather observation.

Further another object of the present invention is to provide an inexpensive resistance-frequency converting circuit for weather observation that is insensitive to a wide range of severe ambient conditions, consisting of simple, inexpensive and easily obtained parts.

Further, another object of the present invention is to provide resistance-frequency converting circuit for weather observation to be considered as expendable.

SUMMARY OF THE INVENTION

The present invention is characterized in that a NOT-circuit is combined with semiconductor switches and a time constant circuit, whereby part of the time constant circuit includes weather sensing elements.

The present invention is further characterized in that a NOT-circuit and two semiconductor switches are used, whereby the two semiconductor switches compose a multivibrator which repeats the switching on-and-off simultaneously.

The present invention is further characterized in that in the time constant circuit the route for charging the time constant condenser is provided apart from the route for discharging the time constant condenser.

The present invention is further characterized in that the charging time constant of the time constant condenser is set so as to be remarkably different from the discharging time constant of the time constant condenser.

The present invention is further characterized in that the weather sensing element is provided in either the condenser charging route or the condenser discharging route in such a manner that the time constant of the route in which the weather sensing element is provided is larger than the time constant of the other route.

The present invention is further characterized in that most of the time in one period of the multivibrator is controlled by the time constant route in which the weather sensing element is provided.

The present invention is further characterized in that the oscillation frequency of the multivibrator is in reciprocal proportion to the resistance value of the weather sensing element.

The present invention is further characterized in that the substantial part of the circuit composing the multivibrator consists of inverters consisting of MOS.FET and C MOS IC.

The present invention is further characterized in that the substantial part of the multivibrator consists of a pair of MOS.FET whose characteristics are complimentary to each other.

The present invention is further characterized in that the substantial part of the multivibrator consists of a semiconductor diode, a transistor and inverters consisting of C MOS IC.

The present invention is further characterized in that the number (generally a plural number) of weather sensing elements provided in a time constant route is determined in accordance with the number of the kinds of facts of the meteorological parameter to be measured.

The present invention is further characterized in that the weather sensing elements provided in a time constant route are connected as an effective component for determining the time constant selectively and in sequence by means of a mechanism independent of the element forming the resistance-frequency converting circuit.

The present invention is further characterized in that the time interval during which either of the weather sensing elements provided in a time constant route is connected as an effective component for forming a time constant is chosen long enough for the period of oscillation of the multivibrator, which is the substantial circuit of the resistance-frequency converting circuit, to deliver a plural number of periods of the oscillation signal, generally in considerable repetition.

EXPLANATION OF THE PREFERRED EMBODIMENTS

Figure 3:
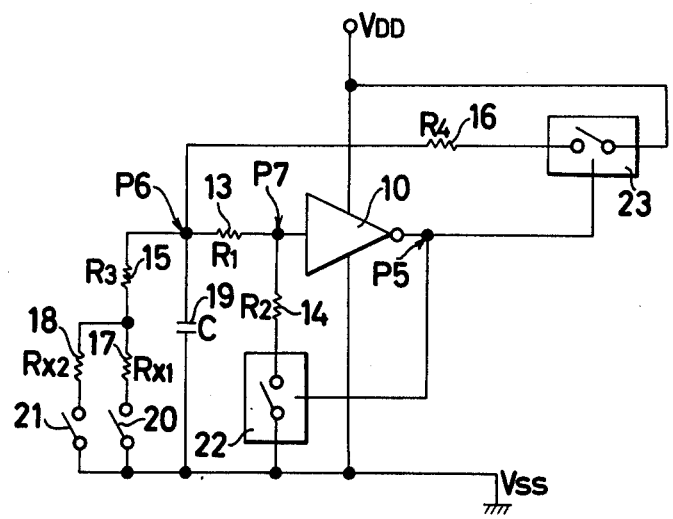
FIG. 3 shows the circuit diagram of the multivibrator for a radiosonde in accordance with the present invention.

In FIG. 3, 10 is an inverter in which C MOS IC is used, 13, 14, 15 and 16 are resistors whose values are respectively $R_1$, $R_2$, $R_3$ and $R_4$, 17 and 18 the weather sensing elements whose resistance values are respectively $R_{X_1}$ and $R_{X_2}$ (the weather sensing elements 17 and 18 are intended for different measurement meteorological parameters (for example the humidity and the temperature), whereby the resistance values $R_{X_1}$ and $R_{X_2}$ are variable so as to assume the values corresponding to the desired measurement parameters), 19 the condenser with capacitance C, 20 and 21 the switches, 22 and 23 the semiconductor switches shown in an equivalent way, $D_{DD}$ the positive terminal of the D.C. voltage source (power source) and $V_{SS}$ the negative terminal. Hereby, the figures $V_{DD}$ and $V_{SS}$ indicate not only the positive and the negative terminal of the D.C. source but also the voltages. Resistor $R_{X_1}$ is a humdity sensor (a carbon hygrometer, for example), while resistor $R_{X_2}$ is a temperature sensor (a thermistor, for example).

Below the composition of the circuit shown in FIG. 3 will be explained.

The output of the inverter 10 is connected to the control terminal of the semiconductor switch 22 and to the control terminal of the semiconductor switch 23.

The semiconductor switches 22 and 23 consist of switch elements that open when the level of the voltage applied to their control terminals is low.

Between the input of the inverter 10 and the negative terminal $V_{SS}$ of the D.C. voltage source circuits, the condenser 19, the resistor 15 and the weather sensing elements 17 and 18 are connected in series with the switches 20 and 21, and are connected to the common resistor 13, while a series circuit consisting of the semiconductor switch 22 and the resistor 14 is connected between the input terminal of the inverter 10 and the negative terminal $V_{SS}$ of the D.C. voltage source and a series circuit consisting of the semiconductor switch 23 and the resistor 16 is connected between the connecting point of the condensor 19 and the resistor 13 and the positive terminal $V_{DD}$ of the D.C. voltage source. When the semiconductor switch 23 is closed, the condensor 19 is charged through the resistor 16, if the semiconductor switch 22 is opened the terminal voltage of the condensor 19 is directly applied to the input terminal of the inverter 10, whereby when the semiconductor switch 22 is closed the terminal voltage of the condenser 19 is applied to the input terminal, being divided by the resistors 13 and 14.

The switches 20 and 21 are the switches for selecting the weather sensing elements 17 and 18 in accordance with the measurement parameters (meteorological factors), whereby they are switched over from each other by means of a mechanism, not shown in the drawing, in such a manner that the weather sensing elements 17 and 18 are never in operation at the same time.

Below the case when the switch 20 is closed while the switch 21 is opened will be explained in accordance with the wave forms shown in FIG. 4, whereby a similar the case when the switch 20 is opened while the switch 21 is closed.

When the voltage at the point $P_7$, serving as the input terminal of the inverter 10, is higher than the threshold level $V_4$ of the inverter 10, the level of the output of the inverter 10 is low, whereby a low level output is applied to the control terminal of the semiconductor switch 22 so as to open the switch 22. Thus at this time, the terminal voltage (at the point $P_6$) of the condenser 19 is applied to the inverter 10 through the resistor 13.

At this time, the low level output is applied to the control terminal of the semiconductor switch 23, whereby the semiconductor switch 23 is in the switched off state. Thus, the D.C. source voltage $V_{DD}$ is not applied to the condensor 19, so that the charge stored in the condensor 19 is discharged through the resistor 15, the weather sensing element 17 and the closed switch 20 in such a manner that its terminal voltage is lowered gradually in accordance with the time constant $C.(R_3 + R_{X_1})$ as is shown with $t_5$ in $P_6$ shown in FIG. 4, whereby the voltage at the point $P_7$ is also lowered.

When the voltage at the point $P_7$ has been lowered below to the threshold level $V_4$ of the inverter 10, the output of the inverter 10 is inverted from low level to high level, so that the semiconductor switch 22 is closed in such a manner that the voltage at the point $P_7$ serving as the input terminal of the inverter 10 is grounded.

Further at this time, the semiconductor switch 23 is closed, whereby the positive voltage $V_{DD}$ of the D.C. source is applied to the point $P_6$, serving as the connecting point of the condenser 19 through the resistor 16 in such a manner that the condenser 19 is being charged while the voltage at the point $P_6$ goes up.

As the voltage at the point $P_6$ goes up, the voltage at the point $P_7$ also goes up until the voltage at the point $P_7$ reaches the threshold level $V_4$ of the inverter 10 again, whereupon the output of the inverter 10 is inverted and the level of the output of the inverter 10 becomes low.

When the level of the output of the inverter 10 has become low both of the semiconductor switches 22 and 23 are opened in such a manner that the voltage at the point $P_7$ becomes equal to that at the point $P_6$, whereby the condenser 19 starts to discharge again in such a manner that the above mentioned operation is repeated so as to maintain the oscillation.

When the semiconductor switch 22 is opened, the voltage at the point $P_6$ becomes equal to that at the point $P_7$ whereby the voltage $V_5$ is represented as follows.

$$V_5 = \frac{R_1 + R_2}{R} \cdot V_4 \qquad (2)$$

Hereby the resistance values are to be chosen as follows.

$$R_4 < R_1 + R_2$$

$$R_4 < R_3 \qquad (3)$$

$$\frac{R_2}{R_1 + R_2} > \frac{V_4}{V_{DD}}$$

hereby $V_{SS} = 0$

Figure 4:
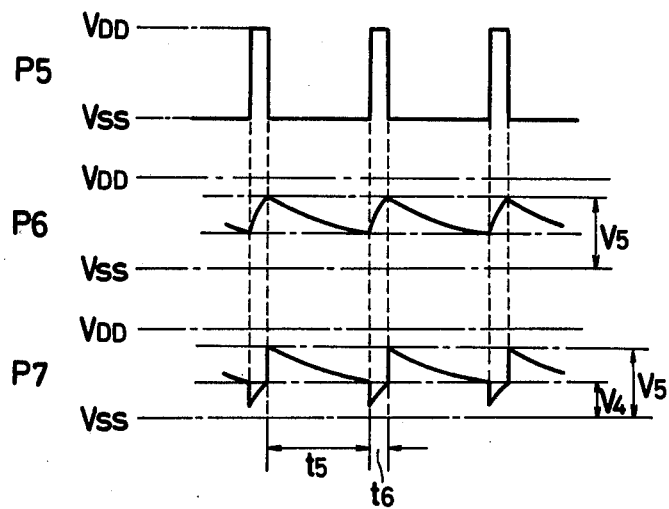
FIG. 4 shows wave forms at those points of the multivibrator in accordance with the circuit diagram shown in FIG. 3, whereby $P_5$, $P_6$ and $P_7$ in FIG. 4 show the wave forms respectively at the points $P_5$, $P_6$ and $P_7$ in FIG. 1.

In FIG. 4, $t_5$ is represented as follows.

$$t_5 = C \cdot (R_3 + R_{X_1}) \ln \frac{V_5}{V_4} \qquad (4)$$

Putting (2) into (4), the following relation is obtained.

$$t_5 = C \cdot (R_3 + R_{X_1}) \ln \frac{R_1 + R_2}{R_2} \qquad (5)$$

Thus, when the ratios $$\frac{R_1 + R_2}{R_2} \text{ and } \frac{R_3}{R_4}$$

are chosen sufficiently large, the charging time $t_6$ is remarkably short as compared with the discharging time $t_5$ in each period, whereby $t_6$ can be considered almost constant even if the value $R_{X_1}$ changes. When $t_6$ is considered as constant the oscillation frequency f is represented as follows.

$$f = \frac{1}{t_5 + t_6} = \frac{1}{C \cdot (R_3 + R_{X_1}) \ln \frac{R_1 + R_2}{R_2} + t_6} \qquad (6)$$

$$= \frac{K_1}{R_e + R_{X_1}}$$

Hereby $K_1$ and $R_e$ are constants.

As is clear from (6), the oscillation frequency f is reciprocally proportional to the resistance value of the weather sensing element so that if the above mentioned constants $K_1$ and $R_e$ may be determined in advance. (They can be obtained as the equivalent constants.) Even if the resistance values $R_{X_1}$ and $R_{X_2}$ change in a wide range the resistance value of the weather sensing element can be obtained from the oscillation frequency by means of the equation (6), so that the result of the observation made by the weather sensing element can be known exactly by means of the oscillation frequency f of the multivibrator.

The result of the actual observation made by means of an embodiment in accordance with the present invention has proved that the reciprocally proportional relation between the resistance value of the weather sensing element and the oscillation frequency f can be obtained within 0.1% error range.

Further as is represented by (5), the period $t_5$ is determined by means of C, $R_3$, $R_{X_1}$ and $(R_1+R_2)/R_2$, having nothing to do with the threshold level $V_4$ of the inverter 10, the D.C. source voltages $V_{DD}$, $V_{SS}$ and so on, so that the irregularity of the characteristics of the applied inverter (in which the integrated circuit (IC) is normally used) has no infuence upon the oscillation frequency. Even if the characteristics of the IC are changed due to fluctuations of the voltage of the D.C. source or of the ambient temperature, the influence upon the period $t_5$ can be neglected. Further $R_3$ is chosen to be greater than $R_4$, $t_6$ corresponding to the charging time of the condenser 19 is remarkably small as compared with $t_5$ corresponding to the discharging time in a period, so that a slight change of the charging time has no influence upon the oscillation frequency f, whereby a stable oscillation can be expected precisely in reciprocal proportion to the resistance value of the weather sensing element.

In the circuit shown in FIG. 5, in place of the switches 20 and 21 Metal-Oxide Semiconductor Field Effect Transistors (hereinafter called MOS.FET) are used, the circuit for activating the weather sensing elements 17 and 18 is composed of the inverter 24. The semiconductor switch 22 consists of a MOS.FET and the semiconductor switch 23 consists of a MOS.FET and an inverter 11, so as to compose an essential part of a multivibrator circuit.

Figure 5:
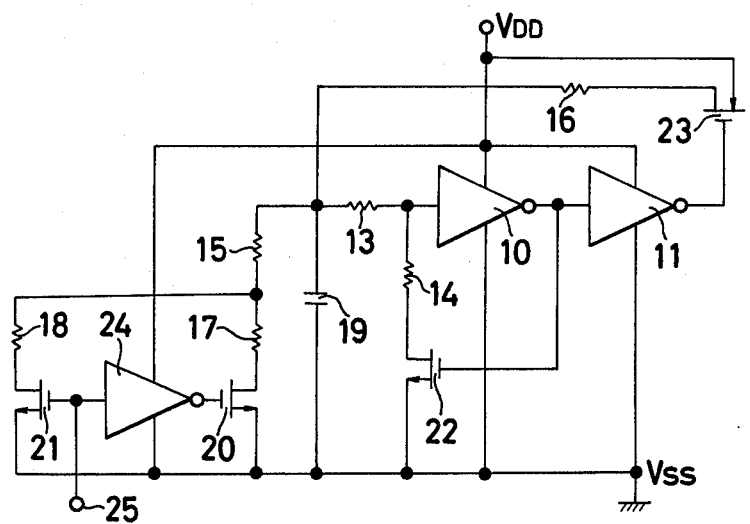
FIG. 5 shows the circuit diagram of another embodiment of the multivibrator for a radiosonde shown in FIG. 3 with the present invention.
Figure 6:
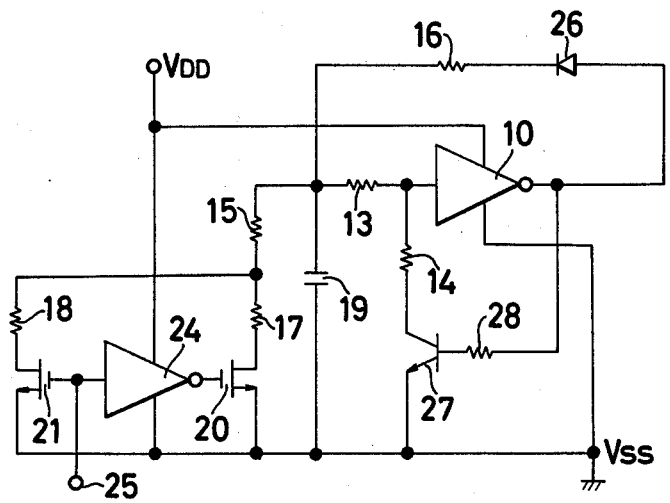
FIG. 6 shows the circuit diagram of another embodiment of the multivibrator for radiosonde shown in FIG. 3 with the present invention.

In the circuit shown in FIG. 6, in place of the switches 20 and 21 the MOS.FET are used. The circuit for activating the weather sensing elements 17 and 18 consists of the inverter 24. The switch which is a semiconductor 22 in the circuit shown in FIG. 5 consists of a transistor 27 and the switch which is a semiconductor 23 in the circuit shown in FIG. 5 consists of a diode 26 so as to compose an essential part of a multivibrator circuit.

Hereby, the function of logic of the inverters 10, 11 and 24 shown in FIG. 5 and FIG. 6 is the same as that of the inverter 10 shown in FIG. 3, whereby they all consist of C MOS IC in the same way as the inverter 10 shown in FIG. 3.

The embodiments shown in FIG. 5 and FIG. 6 have already been explained in accordance with FIG. 3 with the exception of the operation of the switches, so that below only the switching operation will be explained in accordance with FIG. 5 and FIG. 6.

In FIG. 5, 20, 21, 22 and 23 are respectively MOS.-FET, 11 the second inverter, 24 the third inverter, 25 the input terminal of the change over signal, while the other devices are the same as those shown in FIG. 3. Hereby, 10 is called the first inverter.

The circuit consisting of the third inverter 24, MOS.-FET 20 and MOS.FET 21 is the selecting circuit for the weather sensing elements 17 and 18, whereby when the level of the change over signal applied to the input terminal 25 is high, the high level signal is applied to the control terminal of MOS.FET 21, while the high level signal at the input terminal 25, being inverted into a low level signal by means of the third inverter, is applied to the control terminal of MOS.FET 20, so that MOS.-FET 21 is closed while MOS.FET 20 is opened. In consequence, at this time the weather sensing element 18 is connected to the multivibrator in such a manner that the oscillation frequency of the multivibrator changes in accordance with the change of the resistance value.

When on the other hand, the level of the change over signal applied to the input terminal is low, quite contrary to the above operation, the weather sensing element 17 is connected to the multivibrator.

The characteristics of MOS.FET 22 and that of MOS.FET 23 are complimentary to each other in such a manner that when the level of the output of the first inverter 10 is high, MOS.FET 22 is closed, the level of the output of the second inverter 11 becomes low and MOS.FET 23 is closed, while when the level of the output of the first inverter 10 is low, MOS.FET 22 is opened, the level of the output of the second inverter 11 becomes high and MOS.FET 23 is opened. Thus the operation explained in accordance with FIG. 3 is carried out.

20, 21, 24 and 25 in FIG. 6 the are same as those in FIG. 5, 26 a diode acting as switch, 27 a transistor, while the other devices are the same as those in FIG. 3. Hereby, 10 is called the first inverter in the same way as in case of FIG. 5.

The change over operation of the weather sensing elements is the same as that of the circuit shown in FIG. 5.

The transistor 27 is closed when the level of the output of the first inverter 10 is high, while it is opened when the level of the output of the first inverter 10 is low. The diode 26 acts as switch in such a manner that the diode 26 is closed when the level of the output of the first inverter 10 is high, whereby the state is the same as that prevailing when the semiconductor switch 23 in FIG. 3 is closed, while when the level of the output of the first inverter 10 is low the diode 26 is opened, whereby the state is the same as that prevailing when the semiconductor switch 23 in FIG. 3 is opened. Thus the operation explained in accordance with FIG. 3 is carried out.

In the above mentioned embodiments (FIG. 3, FIG. 5 and FIG. 6) the condenser 19 is connected between the point $P_6$ and the D.C. voltage source terminal $V_{SS}$, the oscillation operation is carried out in the same way as if the condensor 19 was connected between $P_6$ and D.C. voltage source terminal $V_{DD}$. In this case only the relationship between the closing and the opening of the semiconductor switches 22, 23 to the charging and the discharging of the condenser 19 is reversed, which is, however, not an essential problem for the present invention at all.

Further in the embodiment $V_{DD}$ is the positive terminal of the D.C. voltage source while $V_{SS}$ is the negative terminal, whereby even if this polarity is reversed, the same operation is carried out as if the inverter and the switch elements with proper characteristics are used. This is not the essential problem for the present invention at all.

Below the strong point of the present invention will be explained by means of a comparison of the conventional device shown in FIG. 1 with the embodiment of the present invention shown in FIG. 3. The strong point to be explained below can be said of the embodiments shown in FIG. 5 and FIG. 6.

Figure 1:
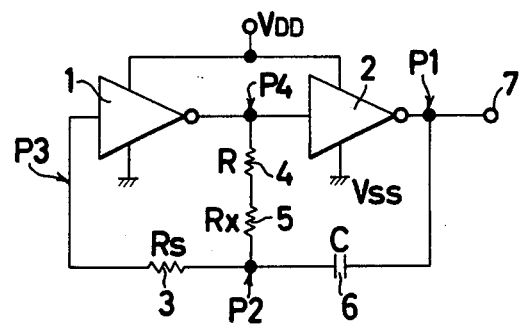
FIG. 1 shows a circuit diagram of a conventional embodiment of the multivibrator for a radiosonde.
Figure 2:
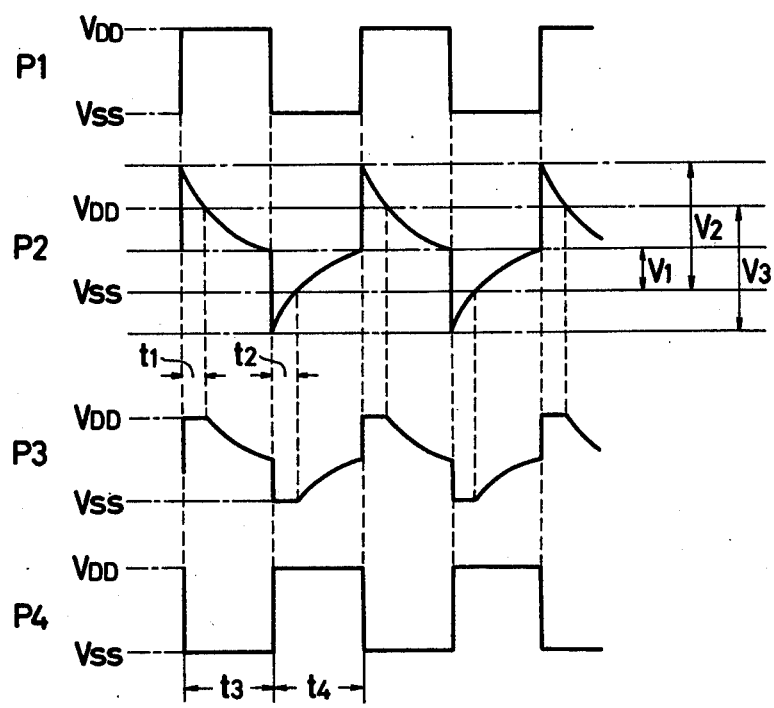
FIG. 2 shows wave forms at those points of the multivibrator in accordance with the circuit diagram shown in FIG. 1, whereby $P_1$, $P_2$, $P_3$ and $P_4$ in FIG. 2 show the wave forms respectively at the points $P_1$, $P_2$, $P_3$ and $P_4$ in FIG. 1.

As is clear from the wave forms shown in FIG. 2 and FIG. 4, the comparison between the conventional equipment shown in FIG. 1 and the embodiment shown in FIG. 5 reveals that in the conventional equipment the peak value $P_2$ at the input terminal of the inverter is periodically above the D.C. source voltage $V_{DD}$ and $V_{SS}$, while when the inverter 10 in FIG. 3 is utilized, the corresponding voltage $P_6$ is within the D.C. source voltage $V_{DD}$ and $V_{SS}$.

This means that if the D.C. source voltage, the resistance value of the weather sensing elements and the value of the resistance connected in series with the weather sensing elements in FIGS. 1 and 3 are all similar, the current passing through the weather sensing elements in the circuit shown in FIG. 3 is less than that passing through the weather sensing elements in the circuit shown in FIG. 1, whereby for example if a thermister is used as a weather sensing element in order to measure the temperature, the temperature rise of the thermister itself due to the Joule heat can be suffficiently low so as to obtain a small temperature measurement error.

Below, the influence of the capacitance between the switches 20 and 21 (the equivalent capacitance between both contacts if the switches 20 and 21 are considered equivalents) upon the oscillation frequency will be explained.

Careful investigation proves that the time $t_3$ in FIG. 3 is proportional to $\ln(V_2/V_1)$ while the time $t_5$ in FIG. 4 is proportional to $\ln(V_5/V_4)$.

If the C MOS IC is of the same type the threshold level $V_1$ and $V_4$ are equal to each other while $V_2$ is larger than $V_5$ so that the weather sensing elements, the resistors and the condenser connected in series with the weather sensing element, are all of the same specifications the time $t_3$ of the conventional equipment is longer than the time $t_5$ of the embodiment of the present invention, so that the time $(t_3+t_4)$ of the conventional equipment is longer than the time $(t_5+t_6)$ of the embodiment of the present invention. This means that for the same oscillation frequency the capacitance of the condenser can be set larger in the embodiment of the present invention than in the conventional equipment. Consequently, the ratio of the capacitance between the contacts to that of the time constant circuit becomes smaller in such a manner that the influence of the capacitance between the contacts upon the oscillation frequency can be chosen less. This means also that in the case of the analog switch in which a C MOS IC is used as in the case of the embodiment shown in FIG. 6, the influence of the stray capacitance in the C MOS IC upon the oscillation frequency is minimal.

Below the strong point of the present invention exemplified in the embodiments shown in FIG. 5 and FIG. 6, where the switches consist of analog switches in which C MOS IC are used will be explained.

As mentioned already, a C MOS IC has such characteristics as low electrical power consumption, wide operation temperature range and so on so as to be best suited for the purpose.

Hereby, unless the voltage input to the C MOS IC is kept within the range of the D.C. source voltage of the C MOS IC, an erroneous operation takes place.

In the embodiment shown in FIG. 1, it is possible that the voltage applied to the weather sensing element could exceed the range of the D.C. voltage source, so that in order to change over a circuit operated with such voltage by means of a switch consisting of C MOS IC it is essential to use another D.C. voltage source whose voltage is higher than that of the D.C. voltage source for the multivibrator, which compels the application of two kinds of D.C. voltage sources.

On the other hand, in accordance with the present invention the voltage applied to the weather sensing elements lies within the range of the voltage of the D.C. source, so that as the D.C. voltage source for the switches and the D.C. voltage source for the multivibrator can be used commonly, one D.C. voltage source suffices. Thus, it can be said that the present invention offers a very inexpensive circuit.

Further, in the conventional device shown in FIG. 1, the current runs through the weather sensing element 5 from $P_2$ to $P_1$ in the time interval $t_3$ during one period, whereby the voltage applied to the weather sensing element 5 changes in accordance with the change of the voltage at $P_2$ and $P_4$. Consequently, if a plural number of the weather sensing elements are needed and semiconductor switches are used for changing over the sensing elements, it would be necessary to use such semiconductor switch elements or circuit compositions as are capable of normal change over even if the direction of the current or the voltage applied on the semiconductor switches changes, so that it is inevitable that the selection of the semiconductor switch elements or the circuit compositions becomes complicated.

On the other hand in the embodiment in accordance with the present invention shown in FIG. 3, the direction of the current running through the weather sensing elements 17 and 18 is determined, which since the switches can be used with the one terminal connected to the D.C. voltage source, so that the switch element can be selected easily in such a manner that good switching characteristics can be obtained with simple circuit compositions.

As explained above, following functional advantages can be obtained in accordance with the present invention.

(a) A multivibrator in which the resistance value of the weather sensing element is precisely in reciprocal proportion to the oscillation frequency in a wide range can be obtained.

(b) The irregularity of the characteristics of the I.C. used has little influence upon the oscillation frequency.

(c) The oscillation frequency is stabilized against changes in the characteristics of the IC due to changes in the power source voltage or the ambient temperature.

(d) The stray capacitance in the circuit elements such as switches has little influence upon the oscillation frequency.

(e) If switches and so on consisting of electronic circuit elements are used in combination with a multivibrator, the switches and the multivibrator can be driven by means of one common power source. Further, the switch elements can be selected easily.

(f) The current which runs through the weather sensing element can be reduced in such a manner that the temperature rise of the weather sensing element due to the Joule heat can be kept negligible so that the error in measurement is little.

(g) A compact, light and economical multivibrator can be obtained.

Hereby, in accordance with the above mentioned embodiment the explanation has been made, relating to a multivibrator for a radiosonde, whereby it goes without saying that the present invention can be applied as a multivibrator for other general purposes than that for radiosonde, while the convertor composing the multivibrator is not necessarily limited to C MOS IC used in the embodiments, whereby various kinds of inverters can be used in accordance with the prevailing circumstances.

What is claimed is:

1. A multivibrator comprising:
   an inverter having input and output terminals;
   a charging circuit having a first switch, a resistor $R_4$ and a condenser connected in series to a D.C. power source, said first switch having a control terminal;
   a circuit connected in parallel to said condenser and having a resistor $R_1$, a resistor $R_2$ and a second switch connected in series, said second switch having a control terminal;
   a discharging circuit connected in parallel to said condenser and having a resistor $R_3$ and a resistor selected from resistors $R_{x1}$ and $R_{x2}$ connected in series;
   means for connecting the junction point of the resistor $R_1$ and the resistor $R_2$ to the input terminal of said inverter; and
   means for connecting the output terminal of said inverter to the control terminal of said second switch and to the control terminal of said first switch, respectively;
   wherein the time constant of said charging circuit being smaller than that of said discharging circuit, the resistance value of the resistor $R_4$ of said charging circuit being smaller than the sum of the resistance values of the resistors $R_1$ and $R_2$ of said circuit.

2. A multivibrator in accordance with claim 1, wherein the resistors $R_{x1}$ and $R_{x2}$ are selected by a switching circuit which includes a first and second MOS FET device in series with $R_{x1}$ and $R_{x2}$, respectively, both devices having control terminals, an inverter whose output terminal also being coupled to the control terminal of one of the devices, the input terminal of the inverter and the control terminal of the other device being commonly connected.

3. A multivibrator in accordance with claim 1, wherein MOS FET devices are employed for each of said switches.

4. A multivibrator in accordance with claim 1, wherein said first switch is a semiconductor diode with its anode connected to the output of the inverter, said second switch is a transistor having its base coupled to the output of the inverter and wherein the inverter is a C MOS IC.

5. A multivibrator in accordance with claim 3, wherein said MOS FET devices have complementary characteristics.

6. A multivibrator adapted for sensing weather phenomena comprising:
   an inverter having input and output terminals;

a charging circuit having a first switch, a resister $R_4$ and a condenser connected in series between the poles of a D.C. power source, said first switch having a control terminal; a circuit connected in parallel to said condenser and having a resistor $R_1$, a resistor $R_2$ and a second switch connected in series, said second switch having a control terminal; a discharging circuit including a first branch circuit in which a weather element sensor $R_{X1}$ and a third switch are connected in series and a second branch circuit connected in parallel with said first branch circuit in which a weather element sensor $R_{X2}$ and a fourth switch are connected in series, said branch circuits having a resistor $R_3$ connected in series therewith, said discharging circuit being connected in parallel to said condenser;

a circuit connecting the junction point of said resistor $R_1$ and said resistor $R_2$ to the input terminal of said inverter; and a circuit connecting the output terminal of said inverter to the control terminal of said second switch and the control terminal of said first switch, respectively;

wherein the time constant of said charging circuit being smaller than that of said discharging circuit, the resistance value of said resistor $R_4$ of said charging circuit being smaller than the sum of the resistance values of the resistors $R_1$ and $R_2$ of said circuit.

7. A multivibrator in accordance with claim 6, wherein the weather element sensors are variable resistors having resistance values which are determined by weather conditions.

8. A multivibrator in accordance with claim 7, wherein said weather element sensor $R_{X1}$ is a humidity sensing element, while said weather element sensor $R_{X2}$ is a temperature sensing element.

9. A multivibrator in accordance with claim 6, including a plurality of weather element sensors corresponding with a plural number of different meteorological factors, said sensors being switched in selectively so as to be sequentially connected for determining the time constant of the time constant path having a larger time constant.

10. A multivibrator in accordance with claim 6, wherein the inverter is of C MOS IC construction.

11. A multivibrator in accordance with claim 9, wherein the circuit for switching in said plurality of weather sensing elements includes at least two MOS FET devices, each device in series with a weather sensing element, said MOS FET devices having a control terminal associated therewith, said circuit also including an inverter of C MOS IC construction having an output terminal connected in series with the control terminal of one of said MOS FET devices, said inverter having an input terminal, the inverter input terminal and the control terminal of the other MOS FET device being commonly connected.

12. A multivibrator comprising:

a first inverter having input and output terminals;

a charging circuit having a switching circuit, a resistor $R_4$ and a condenser connected in series to a D.C. power source, said switching circuit including a second inverter and a first FET switch, the input terminal of said second inverter coupled to the output terminal of said first inverter, and the output terminal of said second inverter coupled to the control terminal of said FET switch, the output terminals of said FET switch connected to said power source and resistor respectively;

a circuit connected in parallel to said condenser and having a resistor $R_1$, a resistor $R_2$, and a second FET switch connected to the output terminal of said first inverter;

a discharging circuit connected in parallel to said condenser and having a resistor $R_3$ and a resistor selected from resistors $R_{X1}$ and $R_{X2}$ connected in series, said selection of resistors being made by a control circuit including a third inverter having input and output terminals and a third and fourth FET switch in series with $R_{X1}$ and $R_{X2}$ respectively, the input terminal of said third inverter and the control terminal of said fourth FET switch being connected together, the control terminal of said third FET switch being connected to the output terminal of said third inverter; and means for connecting the junction point of the resistor $R_1$ and $R_2$ to the input terminal of said first inverter;

wherein the time constant of the charging circuit is smaller than that of the discharging circuit, the resistance value of the resistance $R_4$ of the charging circuit being smaller than the sum of the resistance values of the resistors $R_1$ and $R_2$.

13. A multivibrator in accordance with claim 12, wherein the weather element sensors are variable resistors having resistance values which are determined by weather conditions.

14. A multivibrator in accordance with claim 13, wherein said weather element sensor $R_{X1}$ is a humidity sensing element, while said weather element sensor $R_{X2}$ is a temperature sensing element.

15. A multivibrator in accordance with claim 12, including a plurality of weather element sensors corresponding with a plural number of different meteorological factors, said sensors being switched in selectively so as to be sequentially connected for determining the time constant of the time constant path having a larger time constant.

16. A multivibrator in accordance with claim 12, wherein the inverter is of C MOS IC construction.

* * * * *